United States Patent
Murata et al.

(10) Patent No.: US 7,947,129 B2
(45) Date of Patent: May 24, 2011

(54) ION SOURCE APPARATUS AND CLEANING OPTIMIZED METHOD THEREOF

(75) Inventors: Hirohiko Murata, Toyo (JP); Masateru Sato, Toyo (JP)

(73) Assignee: SEN Corporation, an SHI and Axcelis Company (JP)

( * ) Notice: Subject to any disclaimer, the term of this patent is extended or adjusted under 35 U.S.C. 154(b) by 907 days.

(21) Appl. No.: 10/861,758

(22) Filed: Jun. 4, 2004

(65) Prior Publication Data

US 2005/0016838 A1    Jan. 27, 2005

(30) Foreign Application Priority Data

Jun. 6, 2003   (JP) ................................ 2003-162763

(51) Int. Cl.
    *C25F 3/00*   (2006.01)
(52) U.S. Cl. .............. 134/1.1; 118/723 FE; 118/723 FI; 250/492.21
(58) Field of Classification Search ............ 118/723 FE, 118/723 FI; 250/492.21; 134/1, 1.1, 2, 18, 134/34, 37, 42
See application file for complete search history.

(56) References Cited

U.S. PATENT DOCUMENTS

| | | | | |
|---|---|---|---|---|
| 4,851,693 A | * | 7/1989 | Fisher | 250/492.3 |
| 5,633,506 A | * | 5/1997 | Blake | 250/492.21 |
| 6,221,169 B1 | * | 4/2001 | Bernstein et al. | 134/2 |

FOREIGN PATENT DOCUMENTS

| | | | |
|---|---|---|---|
| EP | 1304731 A1 | * | 4/2003 |
| JP | 402148647 A | * | 6/1990 |
| JP | 403163735 A | * | 7/1991 |
| JP | 05-082608 | | 3/1993 |
| JP | 10-227701 | | 7/1998 |
| JP | 11-148141 | | 5/1999 |
| JP | 2001229841 A | * | 8/2001 |

OTHER PUBLICATIONS

Author: Wolf and Tauber, Title Silicon Processing for the CLSI Era, vol. 1, p. 546-547, 618-619.*

* cited by examiner

*Primary Examiner* — Sharidan Carrillo
(74) *Attorney, Agent, or Firm* — Tarolli, Sundheim, Covell & Tummino LLP

(57) ABSTRACT

An ion source apparatus includes a rare gas supply source supplying rare gas instead of ion source gas to a plasma chamber, means to determine time and timing for cleaning electrodes in consideration of a collecting amount of insulation layers accreting to the electrodes of an extraction electrode system. Based on the above, the ion source apparatus removes the insulation layers by sputtering with ion beam of the rare gas while adjusting extraction or accelerate voltage and supply amount of the rare gas as a setting parameter. Moreover, by adjusting the setting parameter which changes a diameter of ion beam based on the rare gas when the ion beam collides onto each electrode surface of the extraction electrode system, the beam diameter is focused within an effective range in which intension of the sputtering of the insulation layers is maximized thus evenly removing the insulation layers.

9 Claims, 6 Drawing Sheets

ION SOURCE APPARATUS AND CLEANING OPTIMIZED METHOD THEREOF

CROSS REFERENCE TO RELATED APPLICATIONS

The present application claims priority from Japanese Patent Application No. 2003-162763 filed Jun. 6, 2003.

BACKGROUND OF THE INVENTION

1. Field of the Invention

The present invention relates to an ion source apparatus used in an ion implanter, particularly, the ion source apparatus provided with a cleaning function to remove accretion such as boron, phosphorus, etc. collecting in an ion source chamber and an extraction electrode system, and cleaning optimized method thereof.

2. Related Art

In industries, ion implanting technologies have been generally used for implanting impurities to workpieces such as silicon wafers, glass substrates, etc. when mass-producing products such as integrated circuits, flat panel displays, etc. Conventional ion implanters have been provided with an ion source, which enables to ionize desired dopant elements and accelerating the elements to form ion beams having normal energy.

The ion source includes a single plasma chamber made of graphite, aluminum, etc. and an extraction electrode system extracting ions confined in the plasma chamber. The plasma chamber is constituted of side walls, a top wall and a bottom wall thus forming a house. At the top wall, a feed opening for ion source gas and an introduction opening for filaments or antennas are provided whereas an outlet opening for extracting the ion beam is provided at the bottom wall.

The ion source generates the ion beam by ionizing the ion source gas supplied into the plasma chamber. The ion source gas is dopant gas generally desirable for Diborane gas diluted with hydrogen ($B_2H_6H_2$), phosphine gas diluted with hydrogen ($PH_3/H_2$) or arsine gas diluted with hydrogen ($AsH_3/H_2$).

Ionized processes in the plasma chamber are performed by an exciter (antenna element). This antenna element may be heated filaments or antennas using high frequency (or microwave). The heated filaments emit high-energy electrons as a thermoelectron whereas the antennas applied with high-frequency power generate excitation signals of high frequency (or microwave) with high energy into the plasma chamber.

Either the high-energy electrons or the excitation signals allow giving energy to the ion source gas in the plasma chamber making the ion source gas ionized. The desired dopant gas as the ion source gas may be boron (B), phosphorus (P) and arsenic (As).

The extraction electrode system is provided on the bottom side of the plasma chamber and generally includes 4 pieces of electrodes with holes arranged in parallel. These electrodes are a plasma electrode, an extraction electrode, a suppression electrode and a ground electrode, which are formed on the bottom wall of the plasma chamber. Positive electrical voltage for an ion beam extraction from the extraction electrode is supplied to the plasma electrode whereas positive electrical voltage for an ion beam acceleration from acceleration power is supplied to the extraction electrode. Negative electrical voltage repressing reverse-flow electrons from suppression power is supplied to the suppression electrode. Moreover, the ground electrode is grounded Following loading of a workpiece such as a wafer, etc. in a process chamber, a vacuum pumping is performed to the process chamber, and then desired gas is introduced into the plasma chamber via a gas introduction opening. Through these processes, electrons emitted from the filaments in the plasma chamber are ionized by colliding with ionizable gas so as to produce plasma In addition, plasma may also be produced by ionizing the ion source gas in the plasma chamber while high-frequency power is provided to the antennas. The ion in the plasma is extracted as the ion beam via the extraction electrode system applied with high voltage. The ion beam thus extracted and deflected by a mass analysis magnet implants ions to the workpiece in the process chamber without conducting a mass separation.

The ion source gas, generally using Diborane gas diluted with hydrogen as described above, is introduced into the plasma chamber so as to extract the ion beam including boron, and then boron ion as a dopant is implanted to the workpiece. Or, the ion source gas may be phosphine gas diluted with hydrogen. With the same process, the hydrogen-diluted phosphine gas is introduced into the plasma chamber, and phosphorus ion as a dopant is implanted to the workpiece.

As discussed, in case the ion beam has been used for extended periods of time, decomposed boron, phosphorus, etc. are apt to accrete to wall surfaces of the plasma chamber thus causing numerous problems. Further, boron, etc. accreting to the wall surfaces re-evaporate due to heat of the plasma which may cause mixture with plasma. Accordingly, because concentration of ion such as boron ion in the plasma becomes more than previously-determined concentration of element such as boron in gas, and its increasing ratio of the concentration is uncertain, implanted amount cannot be well controlled. This problem will be prominent when conducting implantation of a low concentration.

Furthermore, in case not conducting the mass separation, unnecessary ions (for example, phosphorus ion during doping of boron) may be implanted to the workpiece eventually giving negative impact in the treatment of the workpiece. Specifically, when forming semiconductor components onto the workpiece such as wafer, etc., the condition thereof will deteriorate.

Although the above problem can be solved in such a manner that the ion source is frequently disassembled and cleaned, it requires time and cost. Moreover, while cleaning the ion source, the implanter necessarily refrains from operating for a considerable period of time in which to deteriorate the operating ratio thereof.

For solving the above problem, Japanese patent No. 2956412 discloses a cleaning method for an ion source in that $H_2$ gas is introduced into the ion source when not implanting ions to a sample. By this process the ion source will generate hydrogen plasma thus cleaning the interior of the plasma chamber.

Based on the above method, accretion onto the interior of the plasma chamber is removed from the walls thereof by means of heat of the hydrogen plasma, sputtering, etc. Then, the removed accretion is bound to hydrogen so as to produce a hydrogen compound and evacuated outside via the process chamber in a vacuum pumping.

However, the above cleaning method using $H_2$ gas can only apply to the cleaning in the plasma chamber but not well applicable to accretion such as phosphorus, boron, etc. collected over the surface of electrodes. The reason thereto is that hydrogen ion beams discharge hydrogen ion into a process chamber. Thus, in resumed operation of the ion implantation following the cleaning, the ion beams extracting from the ion source contain more amount of hydrogen ion than necessary.

Thus, because excessive hydrogen ion is implanted at the same time of dopant, it may deteriorate qualitative characters of semiconductor devices. See Japanese patent Application Laid-Open No. 2000-48734

Moreover, Japanese Patent Application Laid-Open No. 2000-340165 discloses another type of cleaning method. In the method, anode electrodes and interior walls of an ion source are subject to cleaning by means of sputtering with positive ions extracted from plasma This reference discloses gases producing plasma for cleaning, that is, material gases for doping, rare gas such as argon, hydrogen or gases mixed therewith.

But, in the above cleaning methods or any conventional cleaning methods, the cleaning is only applicable to the interior of the plasma chamber of the ion source but not applicable to the extraction electrode system placed outside of the plasma chamber.

The surface of the extraction electrodes collects accretion such as boron, phosphorus, etc. similar to the interior walls of the plasma chamber thus forming insulating layers. These insulating layers easily bond electrons and be electrified, causing direct discharges. Further, when the insulating layers get thicker, they delaminate which gives negative influences to the electrodes. Furthermore, portions where boron or phosphorus accretes produce spatial ununiformity over formation of the ion beams passing through the electrode system. These cause an easy electrification, and also a dielectric breakdown will be caused due to lowering of withstanding pressure over insulators between electrodes.

SUMMARY OF THE INVENTION

In view of the forgoing situations, it is an object of the present invention to provide an ion source apparatus with a cleaning function and a cleaning optimized method thereof, which enable to optimize function to remove insulating layers produced by ion source materials such as boron, phosphorus, etc. not only in a plasma chamber but also at an extraction electrode system in particular Further, based on relation between elapsed time of ion implantation and a collected amount of insulation such as boron, phosphorus, etc., time and timing for the cleaning have been decided so as to optimize gas flow for sputtering. Accordingly, the present invention provides a method of optimizing cleaning to the insulating layers accreted to and collected over both the interior walls of the plasma chamber and the extraction electrode system.

In order to achieve the above object, the present invention retains the following structure as recited in claims. For evenly removing the insulating layers produced by the ion source materials accreted to and collected over each surface of electrodes of the extraction electrode system, the cleaning optimized method of the present invention is characterized based on the following steps: rare gas instead of ion source gas is supplied into the plasma chamber thereby forming plasma based on the rare gas; a setting parameter is adjusted to change an ion beam diameter of the rare gas when the ion beam is extracted from the plasma chamber and collides onto each electrode surface of the extractions electrode system; and the ion beam of the rare gas is focused within a range of the ion beam diameter where the sputtering onto the insulating layers is most effectively performed.

According to this structure, the setting parameter of the ion source apparatus can adjust the ion bears diameter when the ion beam collides onto the insulating layers accreted to and collected over each electrode surface of the extraction electrode system.

As the setting parameter, the following may be applied: extraction voltage of the extraction electrode system; supplied amount of the rare gas; high frequency power of an antenna element; a mixing ratio of $H_2$ in the rare gas, etc.

For example, by adjusting the extraction voltage applied to the electrodes of the extraction electrode system, the ion beam diameter of the rare gas is altered to be optimized so that the insulating layers collected over each surface of the electrodes are evenly removed.

Further, since effective rate removing the collected insulating layers is changed according to an ion component, a supplied amount, etc. of the ion beam of the rare gas colliding onto the electrode surfaces, the optimized range of the ion beam diameter for sputtering is set based on relation between ionic species accreting to the electrode surface of the extraction electrode system and the ratio of sputtering.

Furthermore, another cleaning optimized method of the present invention includes the following step; based on tabulation in relation between elapsed time of ion implantation and collecting amount, and tabulation in relation between time taken for cleaning and a changing amount of collection by sputtering, timing to supply the rare gas such as argon into the plasma chamber from a rare gas supply source is determined; according to optimized gas flow determined via a sampling measurement in a pre-cleaning, plasma based on the rare gas is produced in the plasma chamber for cleaning of electrodes; the extraction voltage of the extraction electrode system is adjusted so as to maximize effect of the sputtering onto the insulating layers according to the changing amount of the beam diameter of the ion beam colliding onto the insulating layers; and the ion bean extracted from plasma removes the insulating layers collected over the electrode surfaces of the extraction electrode system.

According to this method, time and timing for cleaning have been determined based on relation in elapsed time of ion implantation and collecting amount of insulation such as boron, phosphorus, etc. while optimized cleaning for both the interior walls of the plasma chamber and the insulating layers of the extraction electrode system can be performed with optimized gas flow for sputtering.

Furthermore, in an ion source apparatus of the present invention, comprising: a gas introduction opening for ion source gas; an outlet opening extracting ion beam; a plasma chamber having antenna elements giving kinetic energy to ion while forming plasma in the chamber; and an extraction electrode system constituting a plurality of electrodes extracting the ion beam from a plasma electrode located at the outlet opening through electric fields, there are provided with a rare gas supply source providing rare gas instead of ion source gas into the plasma chamber and forming plasma based on the rare gas, means to adjust a setting parameter changing a diameter of the ion beam based on the rare gas when the ion beam is extracted from the plasma chamber and collides onto each electrode of the extraction electrode system; and means to determine time and timing to clean the electrodes according to elapsed time of ion implantation and collecting amount of insulting layers accreting to the electrodes of the extraction electrode system.

Furthermore, according to a preferred embodiment of the present invention, He, Ne, Ar, Kr and Xe, or preferably either pure Ar gas or mixed gas of $H_2$ gas and Ar gas, may be applicable to the rare gas. The extraction electrode system includes a plasma electrode, an extraction electrode, a suppression electrode and a ground electrode. By adjusting voltage to the plasma electrode and the extraction electrode, a cleaning ratio of either electrode surfaces of the extraction electrode or interior walls of the plasma chamber, or both can be altered.

As described above, because in the present invention the rare gas such as argon, etc. instead of the ion source gas is supplied to the plasma chamber while ion of the ion beam based on plasma of the rare gas is used for sputtering, the insulation layers accreting over front and back surface of each electrode of the extraction electrode system are easily and speedily removed. Moreover, by adjusting the diameter of the ion beam based on the rare gas according to the setting parameter of the ion source apparatus, the diameter can be adjusted to be optimized, whereby the insulation layers accreting to each surface of the electrodes can be evenly removed.

Furthermore, according to the optimized cleaning method of the present invention, direct discharge caused in that the insulation layers such as boron layers, etc. accreting to the extraction electrode system are electrified with electrons can be suppressed. In addition, by removing accretion such as boron and phosphorus, spatial ununiformity of ion beam formation passing through the extraction electrode system can be recovered Because a maintenance cycle for the ion source can be extended, the apparatus is improved in durability.

In the present invention, mixed gas based on Ar gas and $H_2$ gas is used as a gas source for sputtering, and according to the mixed rate, the insulation layers of either the plasma chamber or the extraction electrode system, or both can be removed. And, because excitation signals based on high frequency or microwave are supplied to antenna, sputtering effect based on Ar gas and $H_2$ gas can be flier improved. Furthermore, by adjusting voltages supplied between the electrodes of the extraction electrode system, either the interior walls of the plasma chamber or the extraction electrode system, or both can be cleaned.

In addition, according to the cleaning optimized method in the present invention, based on tabulation in relation between elapsed time of ion implantation and collecting amount, and between time taken for cleaning and a changing amount of collection by sputtering, timing to supply the rare gas such as argon, etc. to the plasma chamber from the rare gas supply source can be determined thereby improving accuracy and efficiency of operation. Further, by allowing previously-set optimized gas flow according to a sampling measurement based on a pre-cleaning, the insulation layers accreting to each electrode surface of the extraction electrode system can be removed by sputtering within set period of time for cleaning.

BRIEF DESCRIPTION OF THE DRAWINGS

FIG. 5A and FIG. 5B show diagrams viewing a top wall from a bottom side in case nozzles are applied instead of diffusion plates arranged in a plasma chamber;

DESCRIPTION OF THE PREFERRED EMBODIMENTS

Figure 1:
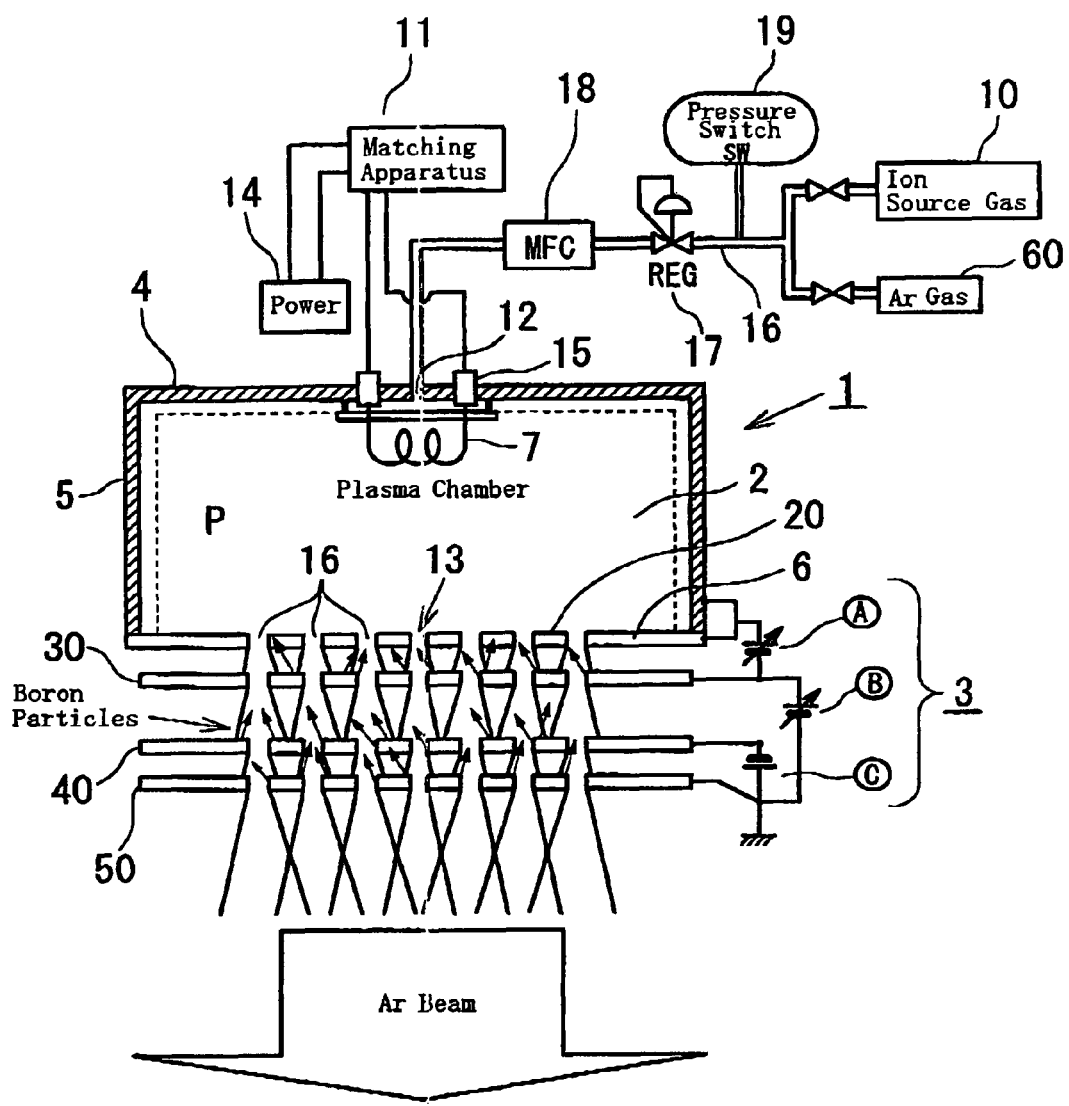
FIG. 1 is a schematic cross-sectional diagram showing an ion source apparatus according to the present invention.

Embodiments of the present invention will be described with reference to the accompanying drawings. FIG. 1 is a schematic cross-sectional diagram of an ion source apparatus according to the present invention. This ion source apparatus 1 includes a plasma chamber 2 generating plasma (in plasma area P) by high-frequency discharge while confining the plasma, and an extraction electrode system 3 extracting ion beam from the plasma in the plasma chamber through electrical field.

The plasma chamber 2 is composed of a top wall 4 having an inlet opening 12 supplying ion source gas 10, side walls 5 provided with permanent magnets (not shown) at outer periphery thereof while integrally formed with the top wall 4, and a bottom wall 6 having an outlet opening 13. The top wall 4 has antenna installation opening 15 connecting to either a high-frequency wave generator or a microwave generator, which generates high-energy excitation signals to antenna element (antenna) 7 arranged in the plasma chamber 2.

Moreover, the bottom wall 6 has a plasma electrode 20 of the extraction electrode system 3 at the outlet opening 13 and also has a plurality of openings 16 for extracting ion from plasma The antenna element 7 may be a coil-shaped filament or antenna, which generates plasma by ionizing the ion source gas 10 supplied into the plasma chamber. In the ion source apparatus of FIG. 1 composed based on ion source of high-frequency wave, the antenna element 7 is connected to a high-frequency power 14 via a matching apparatus 11. While the high-frequency power 14 supplies high-frequency electrical power, high-frequency discharge is generated in the plasma chamber 2 so as to produce plasma by ionizing the ion source gas 10.

The antenna element 7 of a filament type may be a tungsten filament electrically excited via an electric lead wire and emits thermal electrons after properly heated On the other hand, the RF electrical field generated by the antenna, accelerates the electrons and gives the energy to the electrons, thus forming plasma in the plasma chamber 2, and the electrons ionize the ion source gas 10 by mutually reacting therewith.

Plasma produced in the plasma chamber 2 is centralized into the chamber by means of rod-like permanent magnets (not shown) arranged outside of the top wall 4 and the side walls 5 where the magnets are arranged in parallel with longitudinal axes of elongated slots at the outlet opening 13. The permanent magnets are arranged in that N pole and S pole of each magnet are polarized demarcating sections of the magnets while either magnetic pole faces the walls. Thus, magnetic flux runs from the N pole to the S pole of proximal magnets thus making plasma centralized in the plasma chamber 2 by forming a cusped magnetic field.

Figure 2A:
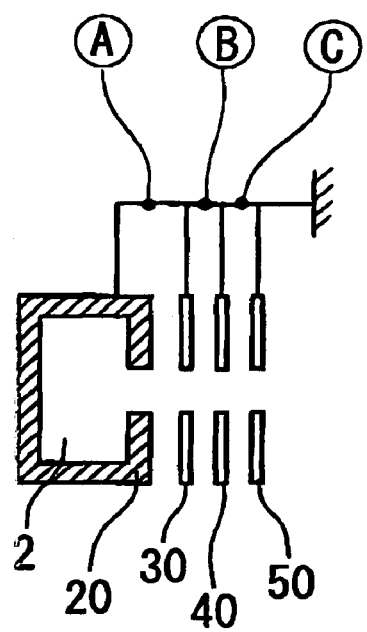
FIGS. 2A and 2B are schematic diagrams showing a relation between a voltage applied to each electrode of an extraction electrode system and extraction potential energy according to the present invention.

As shown in FIG. 1 and FIG. 2A, the extraction electrode system 3 normally being composed of a plurality of electrodes (20, 30, 40 and 50) functions to extract the ion beam from the plasma chamber 2 through an electric field. That is, a plasma electrode 20, an extraction: electrode 30, a suppression electrode 40 and a ground electrode 50 are arranged in order as shown in FIG. 1. These electrodes are normally porous electrodes. The plasma electrode 20, the extraction electrode 30 and the suppression electrode 40 are connected to power A, B and C, respectively and supplied with given extraction or accelerate voltages.

In the plasma electrode 20, a positive voltage, for example 1.5 kV, is applied from the extraction power to the extraction electrodes whereas in the extraction electrode 30, 8.5 KV is supplied from acceleration power to the ground electric potential. Here, energy toward ions will be 10 kV (1.5 kV+8.5 kV). The suppression electrode 40 functions to suppress back-flow of electrons from downside and supplied with —2 kV (suppression voltage), voltage in which to have lower electrical potential than the plasma electrode based on ground electrical potential from the suppression voltage.

Figure 2B:
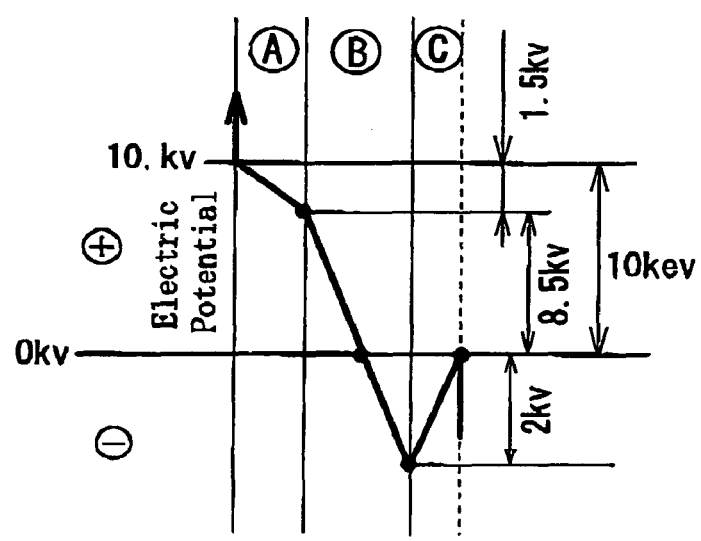

Therefore, the power-supply voltages A, B and C applying each electrodes of the extraction electrode system between the plasma electrode 20 and the ground electrode 50 are 1.5 kV, 10.5 kV and 2 kV respectively as shown in FIG. 2B (see a graph showing a distribution of accelerating potential). According to this graph, extraction potential energy will be approximately 10 keV.

The ion source gas 10 is ionizable dopant gas, and directly or indirectly obtainable from a emission source of compressed gas. The ion source gas is introduced into a pressure regulator 17 through a tube 16. After being regulated to a given pressure, the ion source gas is injected into the plasma chamber with a given flow through a mass flow controller 18. In typical ion source constituents, boron (B), phosphorus (P) and arsenic (As) may be selected, and supplied in gaseous form of Diborane, phosphine, arsine.

The present invention is specifically concerned with a method of removing boron layers of insulation layers collected over interior walls and an extraction electrode system of ion source when using Diborane. Thus, a rare gas supply source 60 is connected to a supply circuit of the ion source gas, whereby either the ion source gas or rare gas (pure Ar gas or mixed gas of $H_2$ gas and Ar gas in the embodiment of the present invention) can be selected via a pressure switch 19. The rare-gas supply source 60 may be, constituted individual from the supply circuit of the ion source gas.

Figure 5A:
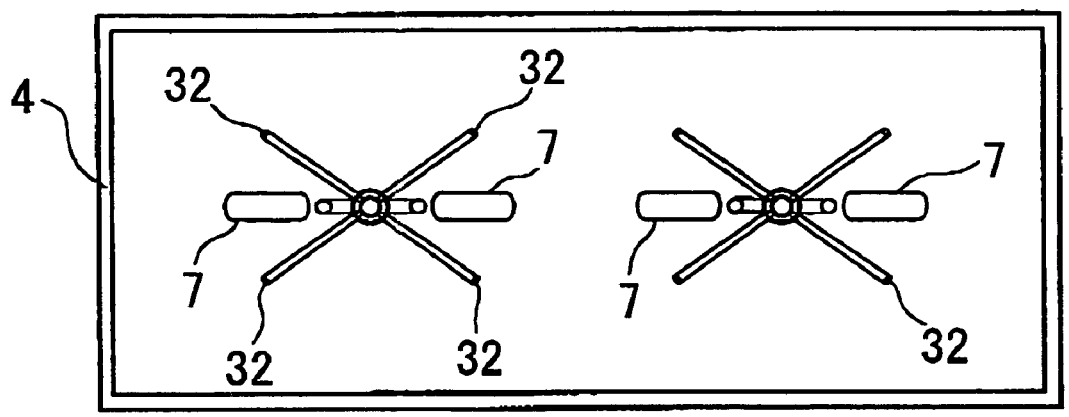
FIG. 5A is a layout diagram exemplifying that 4 pieces of antennas are arranged.
Figure 5B:
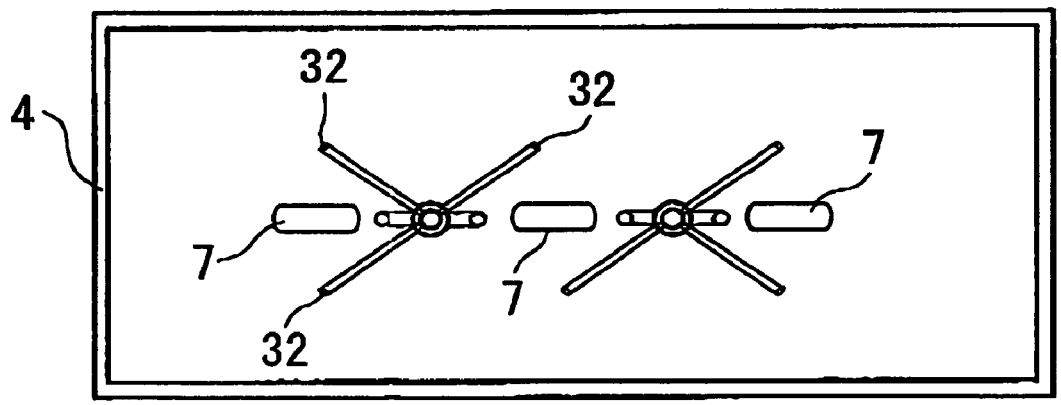
FIG. 5B is also a layout diagram exemplifying 3 pieces of antennas are arranged, and both
Figure 6:
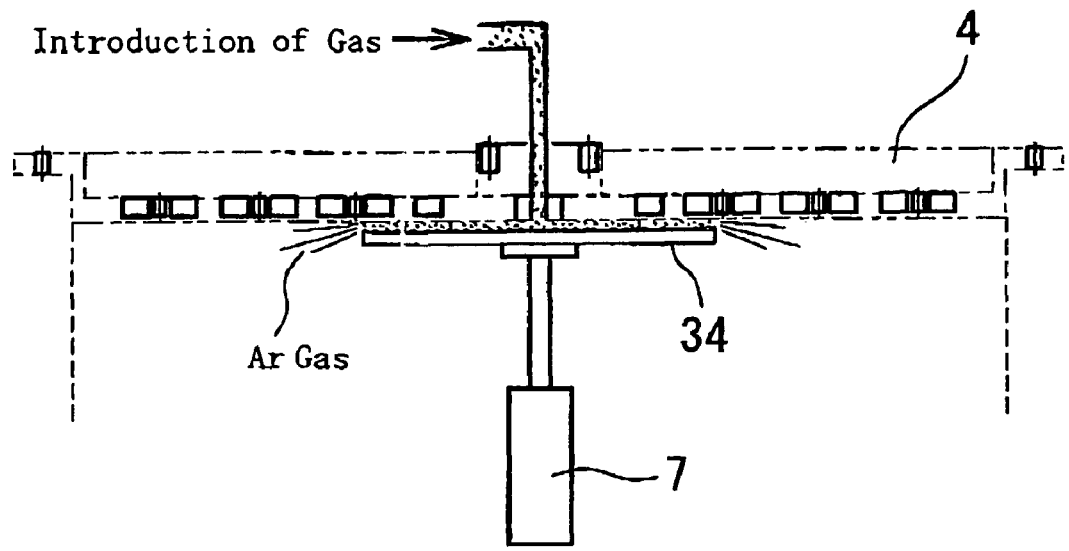
FIG. 6 is a side view showing the diffusion plates arranged for injecting argon gas into the plasma chamber of the present invention.

The rare gas of He, Ne, Ar, Kr and Xe may be used as sputtering gas in the present invention. Preferably, either pure Ar gas or mixed gas of Ar gas and $H_2$ gas is desirable for removing insulation layers of boron For evenly supplying the sputtering gas in the plasma chamber, nozzles 32 are arranged so as to be symmetric about antennas 7. FIG. 5A and FIG. 5B show the arrangement of nozzles 32 in case of being provided with 4 pieces of antennas 7 and three pieces of antennas 7, respectively. Moreover, FIG. 6 shows a gas introduction device in which gas is directly introduced into the ion source from an introduction tube. Here, a diffusion plate 34 is provided as close as possible to the interior top wall of the plasma chamber, so that the sputtering gas is evenly introduced into the plasma chamber through clearance formed between the interior top wall and the diffusion plate 34.

Ar gas 60 is supplied to the plasma chamber instead of the ion gas 10 in consideration of depositional amount of boron and phosphorus in elapsed time of ion implanting. The Ar gas 60 is used to remove insulation layers 21, i.e., boron or phosphorus collecting over each electrode of the plasma chamber 2 and the extraction electrode system 3.

Figure 3:
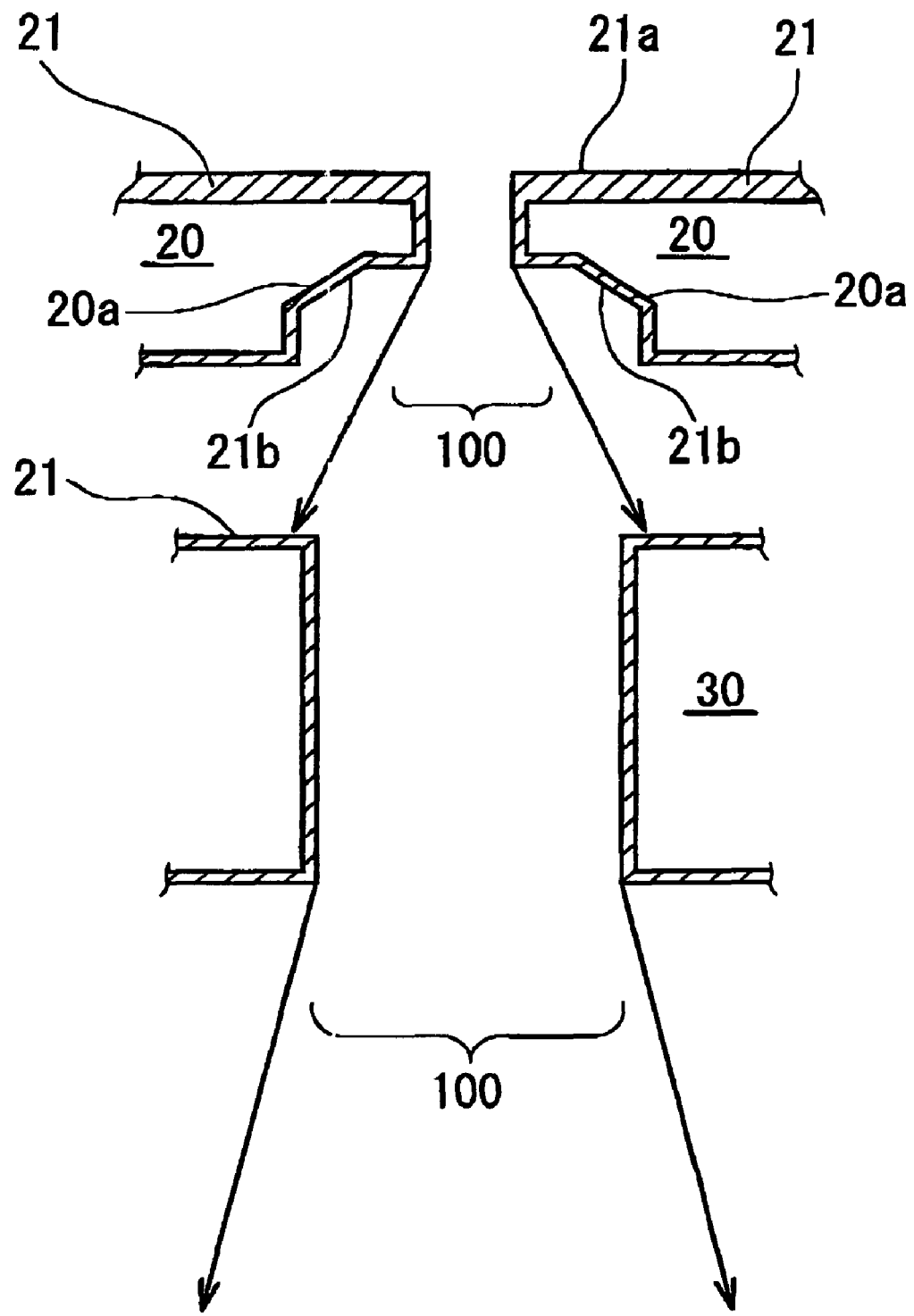
FIG. 3 is a cross-sectional diagram showing both a condition of insulation layers collected over the extraction electrode system and operation of cleaning the insulation layers.
Figure 4:
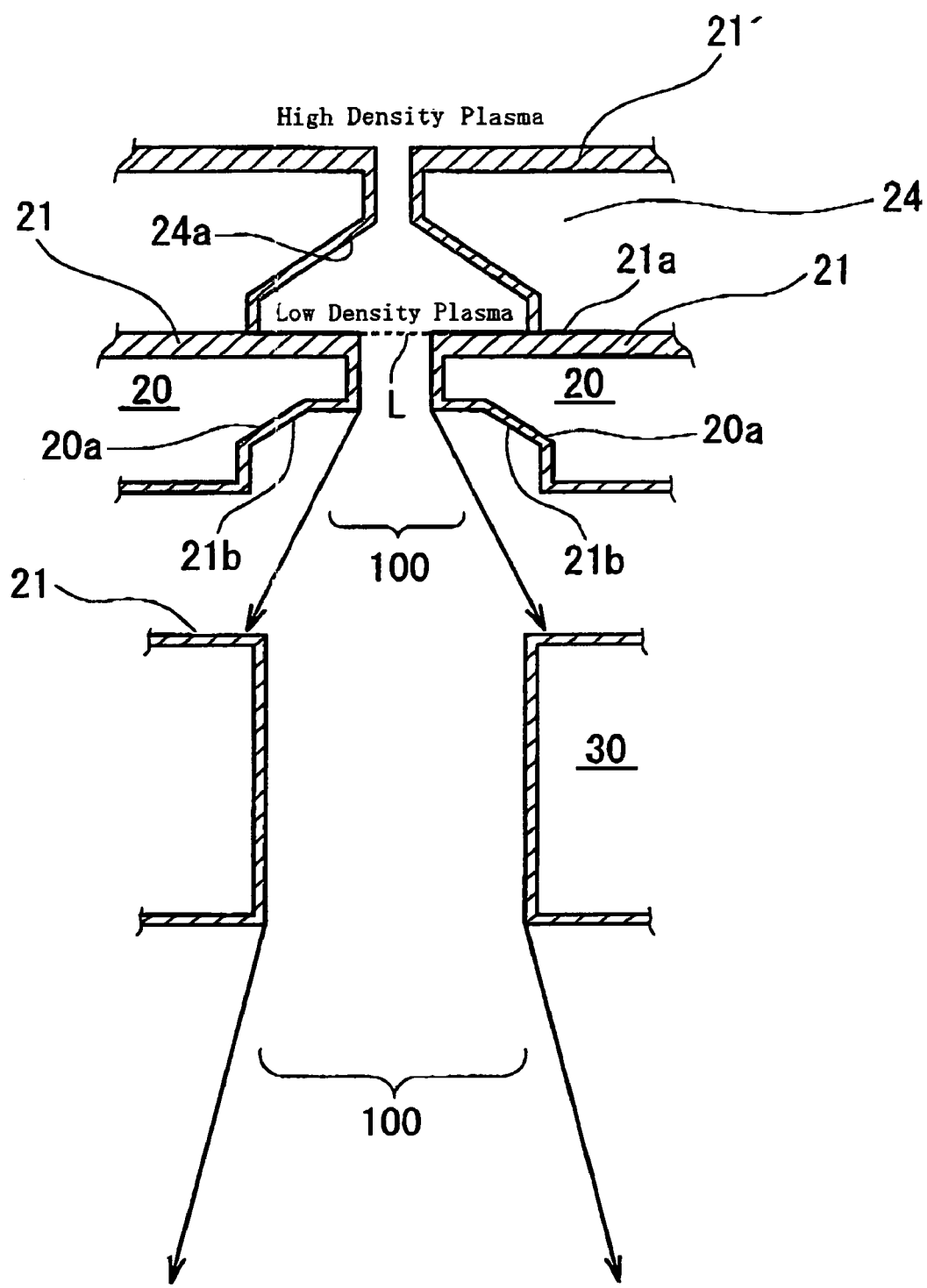
FIG. 4 is a cross-sectional diagram based on FIG. 3 showing operation of cleaning the insulation layers in case a beam shutter is provided.

When ion beam generated through ionizing the ion source gas is extracted from the outlet opening and implanted over workpieces such as wafer, etc. in a process chamber, the insulation layers 21, i.e., accretion of boron, phosphorus, etc., have been formed over electrodes 20, 30 of the extraction electrode system according to kinds of the ion source gas. As shown in FIGS. 3 and 4, the accretion forming the insulation layers 21 is collected over the electrodes 20, 30 of the extraction electrode system. Specifically, thick insulation layers 21*a* have been formed on the front face of the electrodes 20, 30 whereas thin insulation layers 21*b* have been formed on the side face of the inlet portion and back face 20*a* of the electrodes. The amount of accretion will be differed based on the following factors: elapsed time of ion implanting; supply amount of the ion source gas into the plasma chamber per hour, influence when performing a beam shutter (see FIG. 4), etc.

Thus, since it is indispensable to constantly perform cleaning over the electrodes at given regular intervals, the method optimizing flow of the sputtering gas in consideration of the insulation layers accreting over the electrodes will be required.

The above will be described in detail hereinbelow. In the cleaning optimized method of the present invention, the rare gas instead of the ion source gas 10 is supplied to the plasma chamber thus forming plasma based on the rare gas. Then, ion beam of the rare gas extracted from the plasma chamber 2 strikes each face of electrodes of the extraction electrode system 3. Here, in order to evenly perform sputtering over the insulation layers, it will be considerably important to adjust the diameter of the ion beam in which to strike the insulation layers collecting over each face of the electrodes of the extraction electrode systems.

The adjustment of the diameter of the ion beam can be performed with a setting parameter of the ion source apparatus 1. Specifically, the adjustment will allow focusing the diameter of the ion beam within an optimized sputtering range to the insulation layers, whereby the insulation layers can be evenly removed The optimized diameter of the ion beam of the rare gas is selected through the adjustment of the setting parameter of the ion source apparatus, i.e., the adjustment of the extraction voltages or/and supply amount of the rare gas. Furthermore, high-frequency electric power (W) of the antenna and a mixing ratio of $H_2$ included in the rare gas may be factors of the setting parameter.

In one embodiment of the fundamental cleaning method of the present invention, the extraction or accelerate voltages A, B and C of the extraction electrode system 3 and the supply amount of the rare gas are set to given values, and the diameter of the ion beam extracted from plasma based on the rare gas has been observed. Then, either the extraction or accelerate voltages of the extraction electrode system or the supply amount of the rare gas is adjusted to optimize the intension of the sputtering onto the insulation layers under consideration of the diameter of the ion beam striking the insulation layers 21. Or, in another embodiment, both the extraction or accelerate voltages of the extraction electrode system and the supply amount of the rare gas are adjusted so as to optimize the intension of the sputtering onto the insulation layers.

For measuring how much the insulation layers have been evenly removed, for example, a dosed cup may be applied during injection of given amount of boron, phosphorus, etc. after cleaning with argon.

While the optimized cleaning methods of the present invention are performed as discussed above, the embodiments of the ion source apparatus in the present invention are operable based on the following.

When ion beams are introduced via each opening of the electrodes and strike wafers, etc. arranged in the process chamber as shown in FIG. 1, the insulation layers of boron, phosphorus, etc. have been collected over surfaces of the electrodes.

The collecting amount of the insulation layers 21 has been increased in proportion to elapsed time of ion implantation. This, however, allows estimating the gross collecting amount of the insulation layers 21 through measuring the thickness of the insulation layers 21 in the elapsed time of the ion implantation. Moreover, this enables to tabulate correlation between the collecting amount and the elapsed time of the ion implantation.

Relating to the above, how much the collecting amount of the insulation layers 21 has been decreased by means of the ion beam sputtering based on the rare gas according to actual cleaning result is measured. Accordingly, tabulation based on relation of changing rate of the collecting amount of the insulation layers 21 in the elapsed time of cleaning can be obtained.

Time and timing for the cleaning in the present invention can be determined based on data tabulated as above, i.e., based on the collecting amount (or thickness) of the insulation layers 21 accreting to the electrodes of the extraction electrode system in the elapsed time of ion implantation.

Figure 7:
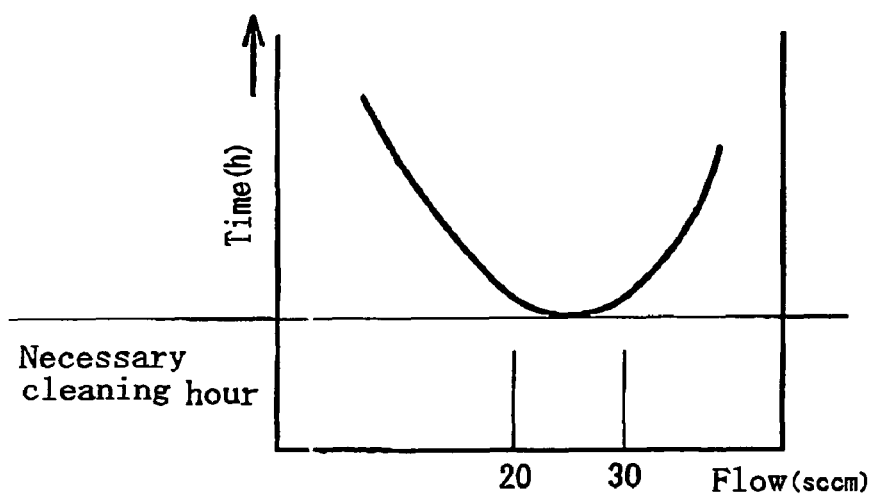
FIG. 7 is a graph showing a relation between flow per unit time and time for indicating optimal flow of sputtering gas.

In the above procedure, first, optimized gas flow is determined based on sampling gained by a pre-cleaning thus maximizing cleaning effect with least flow. This is because that the gas flow less than appropriate causes unnecessary extension of time for cleaning whereas the excessive gas flow causes residual of gas impeding the cleaning effect. Thus, according to FIG. 7 indicating relation of the gas flow in the elapsed time for the cleaning, the present invention determines that optimized time for the cleaning will be appropriately some tens of flow sccm (cc/min).

Cleaning will be effectively performed according to the present invention if cleaning of 4 to 5 hours is allowed per implantation of 100 hours, i.e., 4-5% per total implantation hours.

Timing to perform the cleaning may be determined through a scan measurement to the ion beams with a Faraday cup. Specifically, according to a changing amount of beam current, if spatial ununiformity of the ion beam caused by the insulation layers such as boron layers, etc. collecting over the extraction electrode system becomes beyond a tolerant level, it can be determined that the cleaning should be performed.

Further, according to the ion source apparatus of the present invention, the cleaning can be performed for only the extraction electrode system, or both the extraction electrode system and the, plasma chamber by adjusting a mixed rate of Ar gas and $H_2$ gas. That is, when only the, extraction electrode system is under the cleaning, the mixed rate of Ar gas and $H_2$ gas will be 1:1 whereas when both the extraction electrode system and the plasma chamber are under the cleaning, the ratio will be 0.1:1. And, the mixed rate of Ar gas and $H_2$ gas may be completed by mixing $H_2$ gas of approximately 10% to 90% with Ar gas.

Furthermore, by: controlling electric potential between electrodes of the extraction electrode system, the extraction of the ion beam based on rare gas can be adjusted For example, by setting voltage of adjustable power A between the plasma electrode 20 and the extraction electrode 30 to 0V, the ion beam is no longer extractable. Thus, the cleaning only in the plasma chamber can be conducted by means of, for example, sputtering based on argon plasma On the other hand, in case the voltage of the adjustable power A is set to positive electric potential, the ion beam becomes extractable from the plasma chamber. Moreover, if power between the extraction electrode 30 and the suppression electrode 40 is set to positive electric potential, ions of the ion beam are further accelerated enhancing the sputtering effect.

Accordingly, when conducting the cleaning in the plasma chamber, the electric potential of the adjustable power A is repressed to low. In this case, not only electric potential of adjustable power B is supplied to the extraction electrode 30 but plasma itself has the electric potential, whereby argon ions start to collide each other in the plasma chamber. Thus, accretion over the walls of the plasma chamber can be cleaned. And, the more the voltage of the adjustable power B is increased, the more the extraction intensity of argon ion: gets stronger, whereby the cleaning of the plasma electrode system is optimize in a good condition Furthermore, as shown in FIG. 4, a beam shutter 24 may be provided on front side of the plasma electrode 20. This beam shutter 24 works to narrow the outlet opening in case of lower amount of dose and conversely widen in case of higher amount of dose. According to the embodiment shown in FIG. 4, the carbon-made beam shutter 24 having an undercut portion 24a is arranged on front side of the plasma chamber 20. By sliding the beam shutter 24, the opening can be adjusted, whereby ion beam 100 can pass through either a large opening or a small opening. Specifically, when the width of the shutter opening is, widened, plasma gets closer to the extraction portion thus making the ion beam more easily extracted. High density plasma and low density plasma are formed on the front side and on the back side respectively with the shutter therebetween And, there is a plasma boundary L of the low density plasma on front side of the plasma electrode. In case the insulation layers 21a are formed on the surface of the plasma electrode 20, the plasma boundary L recedes to the plasma electrode 20 thereby deteriorating the extraction of the ion beam 100.

As described, the cleaning optimized method of the ion source apparatus in the present invention includes the following steps; based on tabulation in relation between elapsed time of ion implanting and collecting amount, and between time taken for cleaning and a changing amount of accretion by sputtering time to supply rare gas such as argon, etc. into a plasma chamber from a rare gas supply source is determined; with optimized gas low obtained through a sampling measurement based on a pre-cleaning, plasma based on the rare gas such as argon, etc. is produced in the plasma chamber; extraction or accelerate voltage of an extraction electrode system is adjusted so as to maximize sputtering of insulating layers according to a changing amount of the beam diameter of the ion beam striking onto the insulating layers; by ions extracted from plasma, the insulating layers collected over each surface of electrodes of the extraction electrode system are removed.

Furthermore, timing to supply the rare gas includes the following steps: the ion beam during ion implantation is subject to a scan measurement; in case uniformity according to a changing amount of spatial beam current is over a tolerant value, sputtering by the ion beam extracted from plasma based on the rare gas is conducted. Gas supplied from thee rare gas supply source is mixed gas of argon and hydrogen, and either the plasma chamber or electrode surfaces of the extraction electrode system, or both can be subject to the cleaning by controlling voltages between the plasma electrode 20 and the extraction electrode 30 as well as between the extraction electrode 30 and suppression electrode 40.

A sputtering rate as a parameter can be shown based on a formula below:

$$S=(n_s/n_i)$$

where S is the sputtering rate, $D_i$ is number of particles (ions) incident to a target (insulations layers) to be removed, and nS is number of atoms (molecules) of target sputtered with the particles.

This sputtering me will indicate different values according to ion energy, kinds of ion, materials of insulation layers, incident angles of ions to surfaces of the insulation layers. The relation between the ion energy and the sputtering rate shows an existence of threshold energy in which the sputtering may not be performed unless there is the ion energy more than a certain level. Above the threshold, the sputtering rate monotonously increases with respect to ion acceleration voltages. But, when the ion energy reaches to maximum value, the sputtering rate will decrease regardless of being provided with more energy. In relation of ionic species and the sputtering rate, the sputtering rate tends to increase in general as atomic number gets large thereby more easily forming reaction layers on the surface of the target. In the present invention, the maximum value may be determined based on ion of the rare gases such as Ne, Ar, Kr and Xe having less interaction. Thus, argon in which per-piece cost of material is relatively cheap while atomic number is larger than boron and phosphorus will be most appropriate as gas used for sputtering.

The above description illustrates an example of the present invention. However, the present invention is not limited to the aforementioned embodiments, and various reconfigurations, modification and alterations are possible relating to the above description as long as they are regarded as within the scope of the present invention as set by the scope of the claims and an equivalent construction thereof.

What is claimed is:

1. A cleaning optimized method for use with an ion source apparatus in which a plasma is formed by supplying an implantation ion source gas to a plasma chamber, and ion beams extracted from the plasma pass through an extraction electrode system comprising a plurality of electrodes for creating an electric field to which ion source materials from the ion beam accrete to form an insulation layer of ion source material, wherein the method comprising the steps of:
supplying a rare gas instead of the ion source gas to the plasma chamber thus forming plasma based on the rare gas and extracting a rare gas ion beam from the plasma based on the rare gas; and
changing a beam diameter of the rare gas ion beam colliding onto the insulation layer by adjusting an extraction voltage of the extraction electrode system or adjusting a supply amount of the rare gas to maximize removal of the insulation layer of the ion source material on the extraction electrode system as the rare gas ion beam collides with the insulation layer on the extraction electrode system.

2. The cleaning optimized method according to claim 1, wherein the rare gas is a mixture of $H_2$ gas and Ar gas and a mixing ratio of Ar gas and $H_2$ gas is obtained by diluting Ar gas with $H_2$ gas of approximately 10% to 90% by volume.

3. A cleaning optimized method for use with an ion source apparatus in which a plasma is formed by supplying an implantation ion source gas to a plasma chamber, and ion beams extracted from the plasma pass through an extraction electrode system comprising a plurality of electrodes for creating an electric field to which ion source materials from the ion beam accrete to form an insulation layer of ion source material, wherein the method comprising steps of:
supplying a rare gas instead of the ion source gas to the plasma chamber thus forming plasma based on the rare gas and extracting a rare gas ion beam from the plasma based on the rare gas;
adjusting an extraction voltage of the extraction electrode system at a given value or adjusting a supply amount of the rare gas at a given value to adjust a diameter of the rare gas ion beam to control sputtering of the insulation layer as the rare gas ion beam collides with the insulation layer adhering to the plurality of electrodes of said extraction electrode system.

4. A method for cleaning an ion source apparatus in which a plasma is formed by supplying an implantation ion source gas to a plasma chamber, and ion beams are extracted from the plasma chamber through an extraction electrode system comprising a plurality of electrodes by means of an electric field, an optimized cleaning method for removing deposited insulation layers produced by ions from the implantation ion source gas accreting to and collecting over an electrode surface of the extraction electrode system comprising the steps of:

supplying a rare gas instead of the implantation ion source gas to the plasma chamber to form a plasma based on the rare gas, and extracting a rare gas ion beam from the plasma chamber causing ions in the rare gas ion beam to collide with the electrode surface of the extraction electrode system and sputter etch the electrode surface of the extraction electrode system; and changing a beam diameter of the rare gas ion beam by adjusting a plasma generating parameter of the rare gas supplied to the plasma chamber and/or adjusting an extraction voltage of the extraction electrode system to control a sputtering rate of the rare gas ion beam and maximize sputtering and removing of the deposited insulation layers from the electrode surface of the extraction electrode system.

5. The cleaning optimized method according to claim 4, wherein the plasma generating parameter for changing the beam diameter of the rare gas's ion beam includes adjustment of supplied high-frequency power (w) of an antenna within the plasma chamber and adding hydrogen gas to the rare gas to dilute the rare gas and thereby adjust a mixing ratio of hydrogen gas to the rare gas.

6. The cleaning optimized method according to claim 4, wherein a cleaning time period is determined according to a previously observed elapsed time period of a previous ion implantation and a predicted collecting amount of insulation layers or a predicted thickness of insulation layers accreting on the electrode surface observed during the previous ion implantation.

7. The cleaning optimized method according to claim 4, wherein He, Ne, Ar, Kr and Xe gas, or a mixture of $H_2$ and Ar gas, are used as the rare gas.

8. The cleaning optimized method according claim 4, wherein the extraction electrode system includes a plasma electrode, extraction electrode, suppression electrode and ground electrode, in which cleaning with the rare gas's ion beam's sputtering is determined by adjusting an applied voltage of the plasma electrode and the extraction electrode, and cleaning is performed on the electrode surface of the extraction electrode system and additionally on interior walls of the plasma chamber.

9. The cleaning optimized method according to claim 4, additionally comprising performing ion implantation using the implantation ion source gas and creating a table by measuring a time period of ion implantation and measuring an amount of deposited insulation layers, and tabulating a cleaning time period with the amount of deposited insulation layers and determining an appropriate time to supply the rare gas to the plasma chamber from a rare gas supply source.

* * * * *